(12) United States Patent
Roesler et al.

(10) Patent No.: US 7,696,674 B2
(45) Date of Patent: Apr. 13, 2010

(54) ELECTROACOUSTIC COMPONENT OPERATING WITH GUIDED BULK ACOUSTIC WAVES

(75) Inventors: Ulrike Roesler, Hebertshausen (DE); Jaroslaw Konopka, Pastetten (DE); Werner Ruile, Munich (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/259,687

(22) Filed: Oct. 28, 2008

(65) Prior Publication Data

US 2009/0108961 A1 Apr. 30, 2009

Related U.S. Application Data

(63) Continuation of application No. PCT/DE2007/000765, filed on Apr. 27, 2007.

(30) Foreign Application Priority Data

Apr. 28, 2006 (DE) .................... 10 2006 019 961

(51) Int. Cl.
*H01L 41/08* (2006.01)
(52) U.S. Cl. ...................... 310/358; 310/321
(58) Field of Classification Search ................. 310/313, 310/358–360
See application file for complete search history.

(56) References Cited

U.S. PATENT DOCUMENTS

| 4,159,435 A | 6/1979 | Lewis |
| 4,328,472 A | 5/1982 | Grudkowski |
| 4,333,842 A * | 6/1982 | Ito et al. ............... 252/62.9 R |
| 5,874,869 A * | 2/1999 | Ueda et al. ............... 333/193 |
| 6,037,847 A * | 3/2000 | Ueda et al. ............... 333/193 |
| 2003/0080831 A1 | 5/2003 | Naumenko et al. |
| 2003/0137367 A1 | 7/2003 | Kadota |
| 2005/0162048 A1 | 7/2005 | Solal et al. |
| 2006/0055283 A1 | 3/2006 | Kadota et al. |
| 2006/0076852 A1 | 4/2006 | Ruile et al. |
| 2007/0241841 A1 | 10/2007 | Hauser et al. |
| 2008/0094150 A1 | 4/2008 | Meister et al. |

FOREIGN PATENT DOCUMENTS

| DE | 28 02 946 | 8/1978 |
| DE | 10 2004 037 819 A1 | 3/2006 |
| DE | 10 2005 055 870 A1 | 5/2007 |
| DE | 10 2005 055 871 A1 | 5/2007 |
| DE | 10 2005 055 872 A1 | 5/2007 |
| WO | WO 98/52279 A1 | 11/1998 |
| WO | WO 02/19522 A2 | 3/2002 |

\* cited by examiner

*Primary Examiner*—J. SanMartin
(74) *Attorney, Agent, or Firm*—Slater & Matsil, L.L.P.

(57) ABSTRACT

An electroacoustic component operates with guided acoustic waves and includes a first substrate, a second substrate, a metallic layer and an intermediate layer. The first substrate (S1) is made from a monocrystalline $LiTaO_3$. The metallic layer is arranged between the first substrate and the intermediate layer. The intermediate layer is arranged between the metallic layer and the second substrate. The crystal section of monocrystalline $LiTaO_3$ is chosen such that for the second Euler angle $\mu$: $-100° \leq \mu \leq -40°$ or $-160° \leq \mu \leq -130°$. For the first Euler angle $\lambda$, preferably $\lambda=0°$ and for the third Euler angle $\theta$, $-10° \leq \theta \leq 10°$.

19 Claims, 1 Drawing Sheet

ELECTROACOUSTIC COMPONENT OPERATING WITH GUIDED BULK ACOUSTIC WAVES

This application is a continuation of co-pending International Application No. PCT/DE2007/000765, filed Apr. 27, 2007, which designated the United States and was not published in English, and which claims priority to German Application No. 10 2006 019 961.8 filed Apr. 28, 2006, both of which applications are incorporated herein by reference.

BACKGROUND

Crystal sections of $LiTaO_3$ monocrystals for surface acoustic wave components are known from the publication WO 0219522 A1 or US 2006/0055283 A1, for instance.

SUMMARY

In one aspect, the invention specifies a component operating with guided acoustic waves in which malfunctions that occur due to undesired secondary modes are very slight.

In a first embodiment, an electroacoustic component operates with guided acoustic bulk waves. The component includes a first substrate made from a monocrystalline $LiTaO_3$, a second substrate, a metallic layer, and an intermediate layer (ZS). The metallic layer is arranged between the first substrate and the intermediate layer. The intermediate layer is arranged between the metallic layer and the second substrate. The crystal section of monocrystalline $LiTaO_3$ is chosen such that:

for the first Euler angle $\lambda$, $\lambda = 0°$,
for the second Euler angle $\mu$: $-100° \leq \mu \leq -40°$,
for the third Euler angle $\theta$, $-10° \leq \theta < 0°$, $\theta = 0°$ or $0° < \theta \leq 10°$.

BRIEF DESCRIPTION OF THE DRAWINGS

The component will be explained with the help of schematic figures that are not drawn to scale. The drawings show.

Figure 1:
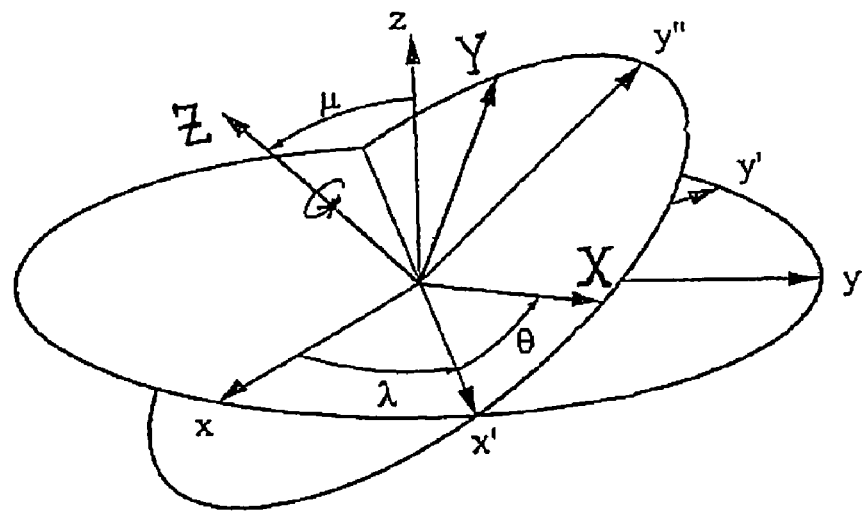
FIG. 1 shows explanations of the Euler angles for a crystal section.

The following reference symbols can be used in conjunction with the drawings:
AE External electrode
DK Plated through-hole
E1, E2 Electrodes
KF1 Contact surface
MS Metallic layer
S1 First substrate
S2 Second substrate
ZS Intermediate layer
x Direction of wave propagation
Y, Z Directions in space
x, x', y, y', y'', z Directions in space
$\lambda$ First Euler angle
$\mu$ Second Euler angle
$\theta$ Third Euler angle

DETAILED DESCRIPTION

A component operating with GBAW (Guided Bulk Acoustic Wave) is specified with a first substrate, a second substrate, a metallic layer and an intermediate layer. The first substrate consists of monocrystalline $LiTaO_3$. The metallic layer is arranged between the first substrate and the intermediate layer. The intermediate layer is arranged between the metallic layer and the second substrate. The crystal section of monocrystalline $LiTaO_3$ is chosen such that a preferred acoustic mode is supported and an acoustic mode which is to be suppressed is suppressed. Preferred crystal sections of monocrystalline $LiTaO_3$ are specified below.

The propagation velocity of waves is preferably greater in the substrate and in the second substrate than in the intermediate layer. Thus, a waveguide is obtained whose jacket is formed by the two substrates and when the core is formed by the intermediate layer and the metallic layer. Moreover, an area of the first and second substrate which is adjacent to the respective boundary surface of the intermediate layer also belongs to the core of the waveguide, wherein the thickness of this area is roughly the length of the wave.

The metallic layer is structured preferably for formation of acoustically active structures (for example, electroacoustic transducers and reflectors), contact surfaces as well as connecting lines. The component can have, in particular, a resonator with a transducer in which the acoustic wave is electrically excitable. A transducer has, as a rule, an electrode grid. The electrodes are in that case, metallic strips that are arranged perpendicular to the direction of the propagation of waves. These are suitable for localization of acoustic waves in the active area of the transducer. The component has a passband and at least one stopband.

A resonator can be characterized by an admittance curve and an electroacoustic coupling coefficient $K^2$. The admittance curve has a resonance (series resonance) at frequency $f_R$ and an anti-resonance (parallel resonance) at frequency $f_{a,R}$. The coupling coefficient can be determined according to the formula $K^2 = \pi^2 (f_{a,R} - f_R)/4 f_{a,R}$.

The acoustic reflection at an electrode can be characterized by a reflection coefficient R. The parameters K and R related to the Rayleigh wave are provided with the index "RW" and the parameters K and R related to the shear wave are provided with the index "SH" in the subsequent discussion.

A crystal section can be specified by three Euler angles. The Euler angles are explained below with the help of FIG. 1. The first Euler angle is denoted subsequently with $\lambda$, the second Euler angle with $\mu$ and the third Euler angle with $\theta$.

At least one wave type, selected from a shear wave and a Rayleigh wave, is excitable in the monocrystalline $LiTaO_3$ depending on the crystal section. In the specified component, only one of these wave types is preferably excited, the other wave type being largely suppressed. The wave type to be excited is known as the principal mode and the wave type to be suppressed is known as the secondary mode.

The shear wave comprises a component which is polarized in the lateral planes X, Y largely transverse to the direction of propagation X of the wave. Moreover, a small wave component that is polarized perpendicular to the lateral plane is present.

The Rayleigh wave comprises a component which is polarized largely perpendicular to the lateral plane. Moreover, a small wave component that is polarized in the lateral plane transverse to the direction of propagation X of the wave can be present.

It was found that the crystal sections exist with which at least one wave type is preferentially excited, wherein the electroacoustic coupling coefficient $K^2$ can be adjusted to be especially small for the other wave type. The cutting angle combination which is optimum for a respective wave type facilitates good suppression of the other wave type. In that case, this combination depends not only on the crystal section, but also on the material and the composition of the metallic layer, the intermediate layer and the second substrate.

For example, in case of a component with a relatively thick metallic layer made of Al, a planarized intermediate layer made from $SiO_2$ and the second substrate made from Si, the electroacoustic coupling coefficient $K^2$ is substantially zero, a) for the shear wave for a crystal section $(0°, \mu, \theta)$ of $LiTaO_3$ with $|\theta| \leq 10°$ and $\mu \approx -142°$, and b) for the Rayleigh wave for a crystal section $(0°, \mu, \theta)$ with $|\theta| \leq 10°$ and $\mu \approx -54°$. This means that the respective wave is not excited in the component or is excited only very weakly. Thus, a wave which occurs as a secondary wave can be largely suppressed for certain crystal sections specified below.

According to a first preferred embodiment, the second Euler angle $\mu$ is chosen in the range of $-100° \leq \mu \leq -40°$ for the first substrate. For the first Euler angle $\lambda$, $\lambda = 0°$ preferably. For the third Euler angle $\theta$, it is preferably $\theta = 0°$ or $|\theta| \leq 10°$. At the boundary layer of the substrate, in this case, a horizontal polarized shear wave can be excited as the principal mode which is a GBAW in one advantageous variant. The horizontal polarization means that the shear wave is polarized substantially in a lateral plane.

In this case, it is especially advantageous if the angle range is $-56° \leq \mu \leq -48°$, especially if the electrodes of the component are made from a relatively light, for example, Al-containing material and therefore, do not have a W-layer.

The component preferably has a transducer in which a shear wave is capable of propagation as a principal mode. The transducer is characterized in that its admittance curve does not have any secondary resonances in the proximity of the resonant frequency $f_R$ for the main resonance.

According to a second preferred embodiment, the second Euler angle $\mu$ is chosen in the range of $-150° \leq \mu \leq -130°$ for the first substrate. For the first Euler angle $\lambda$, $\lambda = 0°$ preferable. For the third Euler angle $\theta$, it is preferably $\theta = 0°$ or $|\theta| < 10°$. At the boundary layer of the substrate, a Rayleigh wave can be excited in this case as the principal mode which represents a GBAW in an advantageous variant. In this case, it is especially advantageous if the angle range is $-146° \leq \mu \leq -136°$, especially if the electrodes of the component are made from a relatively light, for example, Al-containing material and do not have a W-layer.

The component preferably has a transducer in which a Rayleigh wave is capable of propagation as a principal mode. The transducer is characterized in that its admittance curve does not have any secondary resonances in the proximity of the resonance frequency $f_R$ for the main resonance.

Exemplary configurations of the component are specified below according to the first and second embodiments which are characterized by especially stable temperature properties. However, the component is not limited to these examples.

The first substrate and the second substrate each have a thickness of at least 10 wavelengths $\lambda_0$. The second substrate can be designed as a layer in one variant which has, for example, a thickness of at least $0.5\lambda_0$.

It is advantageous if the boundary layer of the intermediate layer which faces the second substrate is flat or planarized. Thus, the first wafer which comprises the first substrate, the metallic layer and the intermediate layer, is bonded to the second substrate with the help of Direct Wafer Bonding.

The second substrate, the intermediate layer and the metallic layer can have many different partial layers.

The metallic layer has electrodes for excitation of an acoustic wave with wave length $\lambda_0$. This refers to the wavelength at a frequency that lies in the passband of the component. The electrodes can form a periodic electrode grid of the transducer, wherein the distance between two electrodes of opposite polarity as measured in the direction of wave propagation being half a wavelength.

The electrodes generally form a periodic electrode grid of the transducer, the distance between two electrodes of opposite polarity as measured in the direction of wave propagation being half a wavelength.

For the examples for calculating crystal sections to be explained below, $\theta = 0°$ and $\lambda_0 = 2.5$ μm.

The metallic layer preferably contains a layer made from a heavy material, such as tungsten, whose thickness with respect to the wavelength is at most 10% and lies between 1% and 6.5% in an advantageous variant.

Moreover, the electrodes can comprise Al or an Al-alloy. They can have at least one Al-layer, for example, but even other layers, especially a Cu-layer. The total height of electrodes can be, for example, up to 10% of the wavelength.

Electrodes that are made up of aluminum are known as Al-electrodes. The statements with regard to Al-electrodes are applicable basically for electrodes that have only layers made up of relatively light metals or are relatively light overall. Electrodes that have a layer of tungsten are referred to as W-electrodes. Electrodes that have a layer of W and a layer of Al are referred to as Al/W-electrodes. The statements with regard to W- and Al/W-electrodes apply basically to electrodes that have at least one layer of relatively heavy metal or are relatively heavy in all.

The portion of metalized area on the surface of the first substrate in the acoustically active area of the component is preferably between 0.3 and 0.7. It is not restricted to this range, however. In the examples explained subsequently, the portion of metalized area in the active area of the component was selected at 0.5.

The second substrate can be made from Si or glass. In the examples explained subsequently, Si was chosen with a crystal section $(0°, 0°, 0°)$. Other Si-crystal sections can also be taken into consideration.

The shear wave in the angle range of $-180° \leq \mu < -160°$ and also $-95° < \mu \leq 0°$ can be considered the principal mode. In these areas, a coupling coefficient of up to about 6.5% can be achieved for the shear wave.

The Rayleigh wave in the angle range of $-160° < \mu < -95°$ can be considered the principal mode. In these areas, a coupling coefficient of up to about 3% can be achieved for the Rayleigh wave.

There are cutting angle areas in which the secondary mode to be suppressed is coupled only very weakly, at $K^2 < 0.05\%$.

For certain values of the Euler angles, only one pure wave mode is capable of propagation in the component. For the embodiment with Al-electrodes, for example, the cutting angle with $\mu = -54°$ is characterized in that the pure shear wave is capable of propagation. In the embodiment with W-electrodes, this is the case for the cutting angle with $\mu = -75°$.

The cutting angle with $\mu = -142°$ is characterized for the embodiment with Al-electrodes in that the pure Rayleigh wave is substantially capable of propagation. This is the case in the embodiment with W-electrodes for a cutting angle with $\mu = -135°$.

The temperature coefficient of frequency f of the electroacoustic component can be described by a Taylor-series:

$$df/f = T0 + TCF1 \Delta T + TCF2 (\Delta T)^2 + \ldots$$

df is the temperature-induced deviation of frequency of the component for a temperature difference $\Delta T$. This can be, for example, the temperature deviation from room temperature or from a specified reference temperature. The coefficient TCF1 preceding the linear term of this series is known as the linear temperature coefficient. T0 is a temperature-independent constant. The coefficient TCF2 preceding the quadratic term of this series is known as the quadratic temperature coefficient. It is assumed that the coefficient TCF2 is small. The curve df/f(ΔT) is essentially a straight line in this case.

The crystal section, the metallization height of the electrodes and the portion of metalized area in the acoustically active area of the component is chosen preferably such that the linear temperature coefficient TCF1 is chosen to be small.

The intermediate layer is preferably made from $SiO_x$ with $1.6 \leq x \leq 2.1$, but, it can also be selected from another material. The thickness of the intermediate layer relative to the wavelength can be, for example, between 20% and 200%. The range between 20 and 80%, in which a relatively high coefficient $K^2$ of electroacoustic coupling can be achieved for the principal mode (shear wave or Rayleigh-wave depending on the component), specifically proves to be particularly advantageous. $K^2 > 4\%$. This is the case for Al-electrodes with a relative thickness of 7.2%. A relative thickness $d_{EL}$ of between 3% and 16% for Al-electrodes, and especially a thickness of about 10%, is advantageous.

For a relative thickness $d_{ZS}$ of the intermediate layer which is between 30% and 60%, $K_{SH}^2 > 5\%$ at $\mu \approx -48°$ for the principal mode (here, shear wave) and a reflection coefficient $R_{SH} > 1.5\%$ can be achieved. The thickness range (40±5) % is considered as optimum, wherein the thickness of Al-electrodes, in this case, is preferably 16%.

For a relative thickness $d_{ZS}$ of the intermediate layer which is between 40% and 55%, the coupling coefficient $K_{SH}^2$ can be achieved between 5.35% and 5.63% and at $\mu \approx -54°$ for the principal mode (here, the shear wave) and $R_{SH} \approx 2.0\%$ can be achieved.

The advantage of a relatively thick intermediate layer is that relatively low values can be achieved for the parameter TCF1. Moreover, the advantage of such an intermediate layer is that a relatively high reflection coefficient $R_{SH}$ and $R_{RW}$ of the wave to be excited can be achieved at one electrode edge.

For different cutting angles of lithium tantalate, it was found: $R_{SH}$ lies in the range between 0% and 3% and $R_{RW}$ lies in the range between 0% and 1.3%. The electroacoustic coupling coefficient can be set between 0% and 6.49%, for the shear wave, and for the Rayleigh wave between 0% and 3%, depending on the cutting angle.

For a short-circuited electrode grid in the component according to the first embodiment with a relative layer thickness of 40%, it was determined: $R_{SH} = 1.8 \ldots 3.0\%$ and $K_{SH}^2 = 1.5\text{-}6.5\%$, with $K^2 > 5\%$ in the range of $-90° \leq \mu \leq -40°$. The range $-56° \leq \mu \leq -48°$ is characterized by an especially low value of electroacoustic coupling coefficient of the Rayleigh wave to be suppressed, for which the following are applicable: $R_{RW} < 0.2\%$ and $K_{RW}^2 \leq 0.02\%$. The electrodes were made from Al with a relative thickness of 7.2%.

For a short-circuited electrode grid in the component according to the second embodiment with a relative layer thickness of 40% in the range of $-150° \leq \mu \leq -130°$, $R_{RW} > 0.5\%$ and $R_{SH} < 0.1\%$. For the Rayleigh wave to be excited, it was found that $K_{RW}^2 > 1.5\%$. For the shear wave to be suppressed, $K_{SH}^2 < 0.4\%$. The electrodes were made from Al with a relative thickness of 7.2%.

It is also possible to achieve a relatively high electroacoustic coupling coefficient $K^2$ as well as a relatively high reflection coefficient R in the electroacoustic component for the wave mode to be excited, with the relevant values for the mode to be suppressed remaining small.

A component operating with GBAW has a thermal coefficient of expansion which lies between those of the first and the second substrate. For the component which is optimized for the excitation of a shear wave with $\mu \approx -54°$, an intermediate layer made from $SiO_2$ with relative thickness $d_{ZS} \approx 40\%$ and Al-electrodes of relative thickness $d_{EL} \approx 7.2\%$ it was determined:

$K_{SH}^2 = 5.63\%$, $R_{SH} = 2.01\%$, TCF1 = $-7 \ldots +7$ ppm/K.

The component with $\mu \approx -54°$, Al-electrodes of relative thickness $d_{EL} \approx 7.2\%$ and $d_{ZS} \in (50\%, 70\%)$ is characterized by stable thermal properties, its coefficient TCF1 lying in the range $-15.5 \ldots 13.0$ ppm/K. The range of relative thickness $d_{ZS}$ between 60% and 65% is considered as especially advantageous in view of thermal stability. In that case, the coefficient TCF1 that lies between $-7$ ppm/K and 7 ppm/K was determined. For the thickness $d_{ZS} 62.5\%$, it was found: $K_{SH}^2 = 4.8\%$, $R_{SH} = 1.8\%$.

For the component with $\mu \approx -54°$, Al-electrodes of relative thickness $d_{EL} \approx 7.2\%$, the range of relative thickness $d_{ZS}$ which lies between 140% and 160% was found to be advantageous.

For the GBAW-component designed for the shear wave as the principal mode, it can be advantageous if the portion η of the metalized surface of the first substrate in the active transducer area lies below 0.5 and especially between 0.25 and 0.3. In that case, an especially high reflection coefficient $R_{SH}$ of up to 2.95% and $K_{SH}^2$ of about 5.2% can be achieved.

For an advantageous component with $\mu \approx -54°$, it can be specified: $d_{EL} = 10\%$, η=0.3, $d_{ZS} = 40\%$. For this component, $R_{SH} = 2.93\%$, $K_{SH}^2$ is between 5.41% and 5.89% and TCF1 is between $-19.5$ ppm/K and $-5.1$ ppm/K.

For another advantageous component with $\mu \approx -54°$, it can be specified: $d_{EL} = 10\%$, η=0.3, $d_{ZS} = 62.5\%$. For this component, $R_{SH} = 2.5\%$, $K_{SH}^2$ is between 4.0% and 5.0% and TCF1 is between $-3.3$ ppm/K and 11.1 ppm/K.

For a component with $\mu \approx -142°$, Al-electrodes of relative thickness $d_{EL} \approx 7.2\%$ and $d_{ZS} \in (20\%, 200\%)$, a coupling coefficient $K_{RW}^2 \approx 2\%$ for the Rayleigh wave, and a reflection coefficient $R_{RW} \approx 0.6\%$ were determined. It is especially advantageous if the range of relative thickness $d_{ZS}$ lies between 30% and 80%.

For a component which is optimized for the excitation of the Rayleigh wave with $\mu \approx -142°$, the intermediate layer made from $SiO_2$ with relative thickness $d_{ZS} \approx 40\%$ and Al-electrodes of relative thickness $d_{EL} \approx 7.2\%$ at η=0.5, it was determined: $K_{RW}^2 = 1.97\%$, $R_{RW} = 0.6\%$, TCF1 = $-45 \ldots -25$ ppm/K.

In case of the GBAW component designed for the Rayleigh wave as the principal mode, it can be advantageous if the portion η of the metalized surface of the first substrate in the active transducer range lies below 0.5 and especially between 0.3 and 0.5. In that case, an especially high coupling coefficient $K_{RW}^2$ of about 2% for the Rayleigh wave can be achieved. For $0.25 \leq \eta \leq 0.30$, a reflection coefficient $R_{RW}$ of about 0.95% and a coupling coefficient $K_{RW}^2$ of about 1.97% were determined.

For an advantageous component with $\mu \approx -142°$, it can therefore be specified: $d_{EL} = 7.2\%$, η=0.3, $d_{ZS} = 40\%$. For this component, $R_{RW} = 0.94\%$ was calculated for the Rayleigh wave, and $K_{RW}^2$ between 1.97% and 2.34% and TCF1 between $-40.0$ ppm/K and $-25.3$ ppm/K was calculated.

A GBAW-component with heavy electrodes made from tungsten is described next. In this case, the shear wave at $-120° < \mu < -30°$ and the Rayleigh wave can be considered as the principal mode at $-150° < \mu < -130°$.

For the component with relative electrode thickness $d_{EL} = 7.2\%$ and relative thickness of the intermediate layer of $10\% \leq d_{ZS} \leq 80\%$, the following was calculated: $28\% \leq R_{SH} \leq 35\%$ and $4.3\% \leq K_{SH}^2 \leq 5.07\%$. The range $20\% \leq d_{ZS} \leq 60\%$ is advantageous in view of an especially high value of $R_{SH} > 32\%$. For the advantageous component with $d_{ZS} = 10\%$, $R_{SH}$ was determined $= 28.65\%$ and $(K_{SH}^2)_{max} = 5.07\%$.

In another advantageous component with relative layer thickness $d_{ZS} = 40\%$ and $\mu = -48°$, the horizontally polarized shear wave is the principal mode. For the range $2\% \leq d_{EL} \leq 12\%$, the following was determined: $4.0\% \leq K_{SH}^2 \leq 7.4\%$ and $9\% \leq R_{SH} \leq 46\%$. For the relative thickness $d_{EL}$ of W-electrodes in the range $2.0\% \leq d_{EL} \leq 3.5\%$ is especially advantageous. For the value $d_{EL} = 2\%$, $R_{SH} = 9.49\%$ and $(K_{SH}^2)_{max} = 6.64\%$.

In addition, components with $-180° \leq \mu \leq 0°$, $d_{ZS} = 40\%$ and W-electrodes with $\eta = 0.5$ and $d_{EL} = 2\%$ were investigated. In this case, a Rayleigh wave and a mixed Rayleigh shear wave are capable of propagation, depending on the crystal section. In the component designed for the shear wave, the values $R_{SH} \geq 8.5\%$ and $K_{SH}^2 > 6\%$ can be realized. In the component designed for the Rayleigh wave, the values $2.0\% \leq R_{RW} \leq 3.0\%$ and $2.5\% \leq K_{RW}^2 \leq 3.5\%$ can be achieved.

The shear wave dominates in the range $-110° \leq \mu \leq -30°$, wherein for the preferred value $\mu = -75°$, $d_{EL} = 2\%$ and $d_{ZS} = 40\%$, a coupling coefficient $K_{SH}^2$ up to 7.64%, a reflection coefficient $R_{SH}$ up to 9.92% and TCF1 between −9.5 ppm/K and 4.5 ppm/K can be achieved.

For the component with the cutting angle $\mu = -75°$, the range $30\% \leq d_{ZS} \leq 60\%$ is considered advantageous for a temperature compensation, the range $30\% \leq d_{ZS} \leq 70\%$ as advantageous with reference to a high value of $R_{SH} \geq 9.5\%$, and the range $20\% \leq d_{ZS} \leq 80\%$ as advantageous with reference to a high value of $K_{SH}^2 > 7.3\%$. The range $40\% \leq d_{ZS} \leq 50\%$ is preferred since, in this case, an especially low value of TCF1 between −9.5 ppm/K and 7.18 ppm/K can be achieved. For this range, $K_{SH}^2$ of about 7.63% and $R_{SH}$ between 9.82% and 9.97% were determined.

For the component with a cutting angle $\mu = -75°$, the range of relative thickness of W-electrodes $1\% \leq d_{EL} \leq 8\%$ is considered advantageous. In that case, a reflection coefficient $R_{SH}$ up to 35.8% can be achieved. In that case the coupling coefficient $K_{SH}^2$ for the shear wave lies between 5.0% and 7.6% for $\eta = 0.5$. The range $0.4 \leq \eta \leq 0.5$ is especially advantageous for $R_{SH} \geq 9.7\%$ and $K_{SH}^2 > 7.5\%$.

For a GBAW component with a first substrate that has the crystal section (0°, −75°, 0°), and W-electrodes, the following exemplary embodiments are preferred:

$d_{ZS} = 40\%$, $d_{EL} = 2\%$, $\eta = 0.5$, for $R_{SH} \approx 9.82\%$, $K_{SH}^2 \approx 7.64\% \ldots 9.08\%$ and $-9.5$ ppm/K $\leq$ TCF1 $\leq 4.5$ ppm/K;

$d_{ZS} = 50\%$, $d_{EL} = 2\%$, $\eta = 0.5$, for $R_{SH} \approx 9.97\%$, $K_{SH}^2 \approx 7.62\% \ldots 9.06\%$ and $-7.22$ ppm/K $\leq$ TCF1 $\leq 7.18$ ppm/K.

The Rayleigh wave dominates in the range $-150° \leq \mu \leq -130°$, with the value $\mu = -135°$ being preferred. The range of relative thickness $d_{EL}$ of W-electrodes between 2% and 10% is preferred in that case. A variant with $d_{EL} = 2\%$ and $d_{ZS} = 40\%$ is especially advantageous. For this variant, $K_{RW}^2 = 2.88\%$, $R_{RW} = 1.88\%$ and $-28.1$ ppm/K $\leq$ TCF1 $\leq -13.7$ ppm/K.

For a component with $\mu = -135°$, the range of relative thickness of W-electrodes $d_{EL} \approx 6\%$ is advantageous since in this case, high values for the coefficients $K_{RW}^2 > 3.5\%$ and $R_{RW} \geq 5.3\%$ can be achieved. The relative thickness of W-electrodes $d_{EL} = 6\%$ and the relative thickness of intermediate layer $d_{ZS} = 60\%$ is especially advantageous. For this variant, $K_{RW}^2 = 3.60\%$, $R_{RW} = 6.27\%$ and TCF1 were determined between −20.6 ppm/K and −6.2 ppm/K.

For a component with $\mu = -135°$, the range $0.4 \leq \eta \leq 0.5$ is preferred for the relative metallization ratio $\eta$. For this range, $K_{RW}^2 = 3.6\%$ for the Rayleigh wave to be excited and $R \geq 6.3\%$.

Further, electrodes such as Al/W- or AlCu/W-electrodes, i.e., electrodes with a partial layer made of Al and/or AlCu and another partial layer made from W, can be used in the component. In a first advantageous variant, the thickness of the W-layer can be 2% and the thickness of Al- and/or AlCu-layer can be selected between 0.4% and 10%. In a second preferred variant, for example, the thickness of the W-layer can be selected at 6% and the thickness of Al- and/or AlCu-layer can be selected between 0.4% and 6%. In principle, the ratio of partial layers can be adjusted arbitrarily.

The component will now be explained in more detail with the help of schematic figures.

The Euler angles are explained with the help of FIG. 1. The axes of the physical crystal coordinate system (x, y, z) are directed along the crystal-axes (a, b, c) of an elementary cell of a monocrystal. The first Euler angle λ describes a rotation of the coordinate system about the z-axis; refer to FIG. 1. The coordinate system rotated once is known as (x', y', z). The second Euler angle μ describes a rotation of the once-turned coordinate system about the x'-axis. In that case, one goes over to the coordinate system (x', y'', Z). The third Euler angle θ describes a rotation of the twice-rotated coordinate system about the z-axis. The X-axis of the coordinate system (X, Y, Z) obtained in this way is directed in the direction provided as the direction of propagation of acoustic waves. The acoustic wave propagates in the X, Y plane which is also known as the intersecting plane of the substrate. The Z-axis is the normal to this plane.

Figure 2:
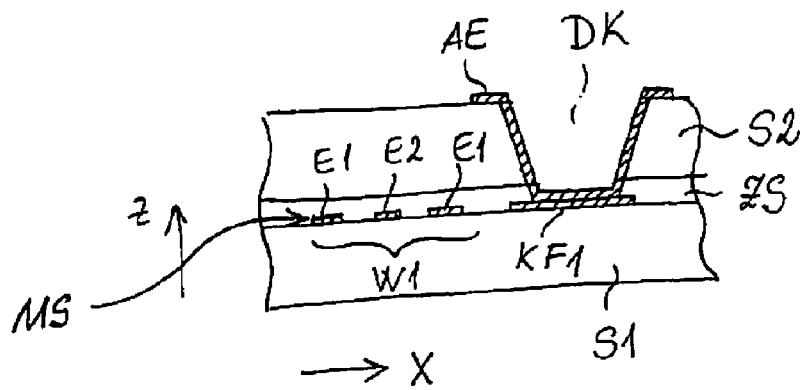
FIG. 2 is a component operating with Guided Bulk Acoustic Wave (GBAW).

In FIG. 2, a component with a transducer W1 in which a guided acoustic bulk wave (GBAW) can be excited is shown in part.

The first substrate S1 is lithium tantalate with one of the specified crystal sections. A metallic layer MS is arranged on the first substrate S1 which has the transducer WI and an electrical contact surface KF1 which is connected to it. The transducer comprises electrodes E1, E2, with first electrode E1 and the second electrode E2 are arranged alternately in the direction of propagation X. They extend in the lateral plane transverse to this direction.

The structures E1, E2, KF1 of the metallic layer are covered with an intermediate layer ZS which seals the exposed surface of the first substrate S1. The intermediate layer ZS is at least as high as this metallic layer.

The contact surface KF1 can be contacted externally with the aid of a plated through-hole DK running through the second substrate S2 and the intermediate layer ZS. This plated through-hole is a hole whose surface is covered with metallization. The metallization also lies even on the exposed surface of second substrate S2 and forms an external contact AE.

The component is not limited to the example shown in FIG. 2. In particular, embodiments which are described in the patent applications DE 10 2005 055870.4, DE 10 2005 055871.2 and DE 10 2005 055872.0, which are each incorporated herein by reference, are possible.

What is claimed is:

1. An electroacoustic component operating with guided bulk acoustic waves, the component comprising:
    a first substrate made from a monocrystalline LiTaO$_3$;
    a second substrate;
    a metallic layer; and
    an intermediate layer;
    wherein the metallic layer is arranged between the first substrate and the intermediate layer;

wherein the intermediate layer is arranged between the metallic layer and the second substrate; and wherein a crystal section of monocrystalline LiTaO$_3$ is chosen such that for a first Euler angle λ, λ=0°, for a second Euler angle angle μ: −100°≦μ≦−40° or −160°≦μ≦−130°, and for the third Euler angle θ, −10°≦θ<0° or θ=0° or 0°<θ≦10°; and wherein the electroacoustic components operates with guided bulk acoustic waves.

2. The component according to claim 1, wherein −100°≦μ≦−40°.

3. The component according to claim 2, wherein a horizontally polarized shear wave can be excited.

4. The component according to claim 3, wherein −44°≦μ≦−64°.

5. The component according to claim 2, wherein −85°≦μ≦−65°.

6. The component according to claim 1, wherein −160°≦μ≦−130°.

7. The component according to claim 6, in which a Rayleigh wave can be excited.

8. The component according to claim 7, wherein −146°≦μ≦−131°.

9. The component according to claim 1, wherein the metallic layer is arranged on the first substrate and has electrodes for exciting an acoustic wave with wavelength λ$_0$.

10. The component according to claim 9, wherein the metallic layer comprises a W-layer.

11. The component according to claim 9, wherein the metallic layer comprises an Al-layer.

12. The component according to claim 1, wherein the intermediate layer comprises a planarization layer.

13. The component according to claim 12, wherein the intermediate layer comprises SiO$_x$ with 1.6≦x≦2.1.

14. The component according to claim 12, wherein the intermediate layer has a thickness between 20% and 200% with respect to wavelength λ$_0$, wherein λ$_0$ comprises an acoustic wavelength at which the first substrate is excited.

15. The component according to claim 12, wherein the second substrate comprises Si.

16. The component according to claim 12, wherein the first substrate and the second substrate each have a thickness of at least 10λ$_0$, wherein λ$_0$ comprises an acoustic wavelength at which the first substrate is excited.

17. The component according to claim 1, wherein −10°≦θ<0°.

18. The component according to claim 1, wherein θ=0°.

19. The component according to claim 1, wherein or 0°<θ≦10°.

* * * * *